(12) United States Patent
Winters et al.

(10) Patent No.: US 7,999,454 B2
(45) Date of Patent: Aug. 16, 2011

(54) OLED DEVICE WITH EMBEDDED CHIP DRIVING

(75) Inventors: Dustin L. Winters, Webster, NY (US);
John W. Hamer, Rochester, NY (US);
Gary Parrett, Rochester, NY (US);
Christopher Bower, Raleigh, NC (US);
Etienne Menard, Durham, NC (US)

(73) Assignees: Global OLED Technology LLC, Herndon, VA (US); Semprius, Inc., Durham, NC (US)

( * ) Notice: Subject to any disclaimer, the term of this patent is extended or adjusted under 35 U.S.C. 154(b) by 331 days.

(21) Appl. No.: 12/191,478

(22) Filed: Aug. 14, 2008

(65) Prior Publication Data
US 2010/0039030 A1    Feb. 18, 2010

(51) Int. Cl.
H05B 33/08    (2006.01)
H01L 51/00    (2006.01)

(52) U.S. Cl. .......... 313/500; 313/506; 313/504
(58) Field of Classification Search .......... 313/505, 313/500, 504, 506
See application file for complete search history.

(56) References Cited

U.S. PATENT DOCUMENTS

| | | | |
|---|---|---|---|
| 4,356,429 | A | 10/1982 | Tang |
| 5,550,066 | A | 8/1996 | Tang et al. |
| 7,169,652 | B2 | 1/2007 | Kimura |
| 2003/0090603 | A1* | 5/2003 | Chae et al. .......... 349/43 |
| 2003/0173069 | A1 | 9/2003 | Nitta et al. |
| 2003/0176069 | A1 | 9/2003 | Yuasa et al. |
| 2006/0055864 | A1 | 3/2006 | Matsumura et al. |
| 2006/0290831 | A1* | 12/2006 | You .......... 349/56 |
| 2007/0141809 | A1 | 6/2007 | Ponza et al. |
| 2007/0257606 | A1 | 11/2007 | Winters et al. |
| 2008/0108171 | A1 | 5/2008 | Rogers et al. |

OTHER PUBLICATIONS

U.S. Appl. No. 11/145,574, entitled Methods and Devices for Fabricating and Assembling Printable Semiconductor Elements, filed on Jun. 2, 2005.
U.S. Appl. No. 11/423,192, entitled Pattern Transfer Printing by Kinetic Control of Adhesion to an Elastomeric Stamp, filed Jun. 9, 2006.
U.S. Appl. No. 11/851,182, entitled "Controlled Buckling Structures in Semiconductor Interconnets and Nanomembranes for Stretchable Electronics", filed in Sep. 6, 2007.

* cited by examiner

*Primary Examiner* — Karabi Guharay
(74) *Attorney, Agent, or Firm* — Morgan, Lewis & Bockius LLP

(57) ABSTRACT

An electroluminescent device having a plurality of current driven pixels arranged in rows and columns, such that when current is provided to a pixel it produces light, including each pixel having first and second electrodes and current responsive electroluminescent media disposed between the first and second electrodes; at least one chiplet having a thickness less than 20 micrometers; including transistor drive circuitry for controlling the operation of at least four pixels, the chiplet being mounted on a substrate and having connection pads; a planarization layer disposed over at least a portion of the chiplet; a first conductive layer over the planarization layer and connected to at least one of the connection pads; and a structure for providing electrical signals through the first conductive layer and at least one of the connection pads of the chiplet so that the transistor drive circuitry of the chiplet controls current to the four pixels.

17 Claims, 12 Drawing Sheets

300

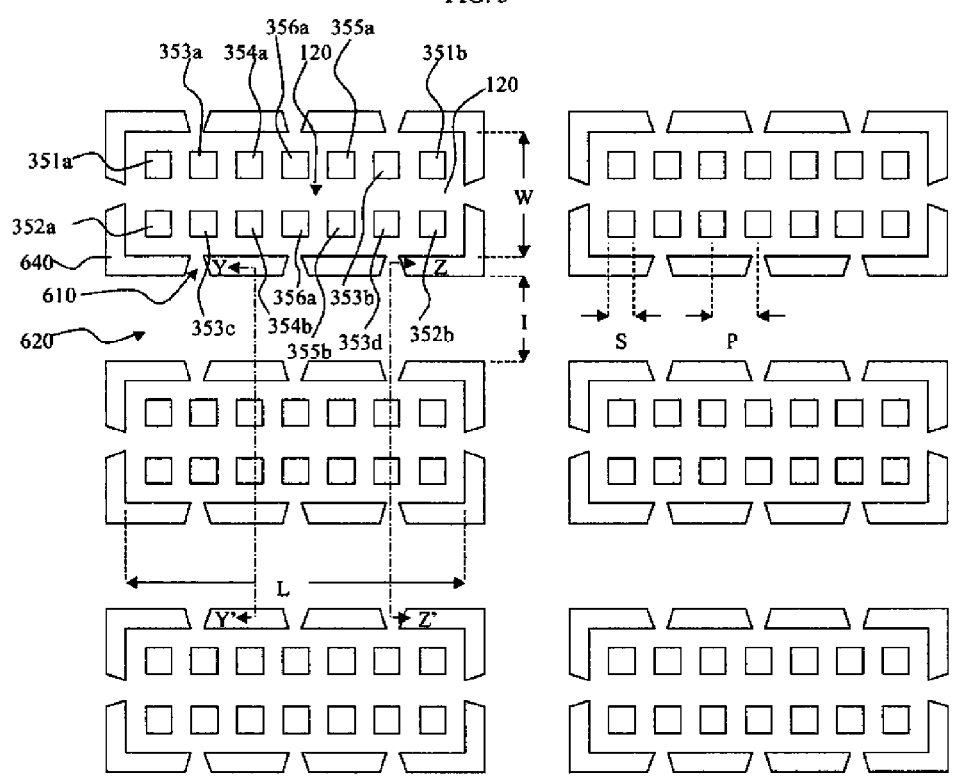

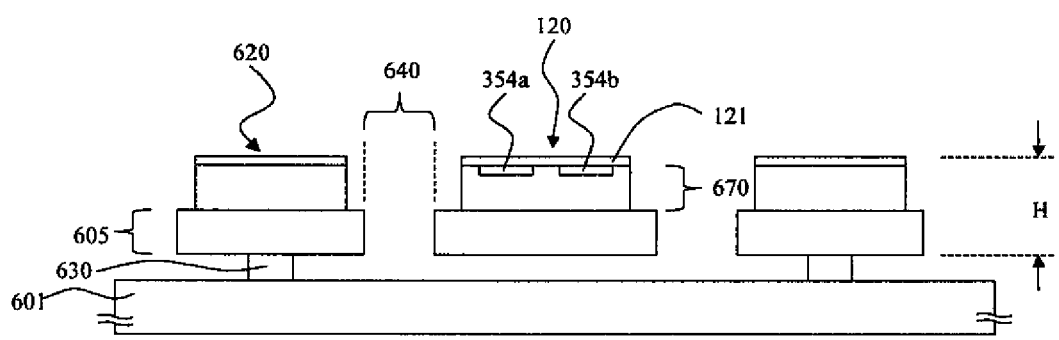
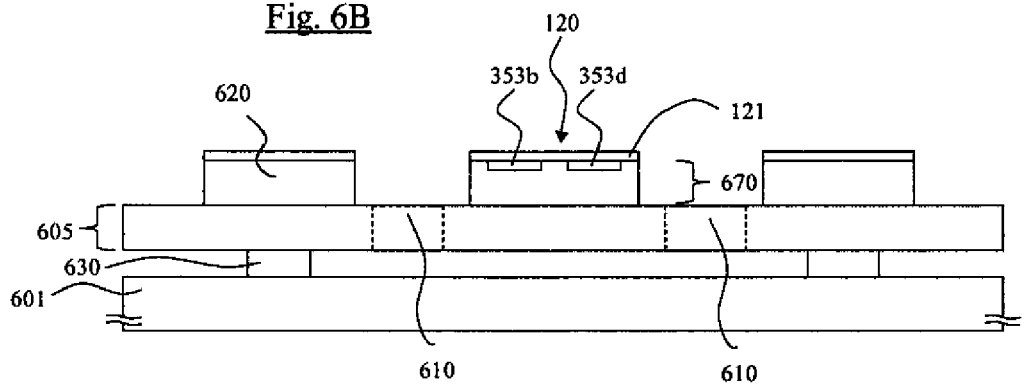

OLED DEVICE WITH EMBEDDED CHIP DRIVING

FIELD OF THE INVENTION

The present invention relates to an electroluminescent display with semiconductor driving elements.

BACKGROUND OF THE INVENTION

In the simplest form, an organic electroluminescent (EL) device is comprised of an organic electroluminescent media disposed between first and second electrodes serving as an anode for hole injection and a cathode for electron injection. The organic electroluminescent media supports recombination of holes and electrons that yields emission of light. These devices are also commonly referred to as organic light-emitting diodes, or OLEDs. A basic organic EL element is described in U.S. Pat. No. 4,356,429. In order to construct a pixelated OLED display device that is useful as a display such as, for example, a television, computer monitor, cell phone display, or digital camera display, individual organic EL elements can be arranged as pixels in a matrix pattern. These pixels can all be made to emit the same color, thereby producing a monochromatic display, or they can be made to produce multiple colors such as a three-pixel red, green, blue (RGB) display. OLED display devices have also been fabricated with active matrix (AM) driving circuitry in order to produce high performance displays. An example of such an AM OLED display device is disclosed in U.S. Pat. No. 5,550,066. Active matrix circuitry is commonly achieved by forming thin film transistors (TFTs) over a substrate and the Organic electroluminescent media over the TFTs.

These TFTs are composed of a thin layer (usually 100-400 nm) of a semiconductor such as amorphous silicon or polysilicon. The properties of such thin film semiconductors are, however, often not sufficient for constructing a high quality OLED display. Amorphous silicon, for example, is unstable in that its threshold voltage (Vth) and carrier mobility shifts over extended periods of use. Polysilicon, often has a large degree of variability across the substrate in threshold voltage (Vth) and carrier mobility due to the crystallization process. Since OLED devices operate by current injection, variability in the TFTs can result in variability of the luminance of the OLED pixels and degrade the visual quality of the display. Novel compensation schemes, such as adding additional TFT circuitry in each pixel, have been proposed to compensate for TFT variability, however, such compensation adds complexity which can negatively impact yield, cost, or reduce the OLED emission area. Furthermore, as thin film transistor fabrication processes are applied to larger substrates such as used for large flat-panel television applications, the variability and process cost increase.

One approach to avoid these issues with thin film transistors is instead to fabricate conventional transistors in a semiconductor substrate and then transfer these transistors onto a display substrate. U.S. Patent Application Publication No. 2006/0055864 A1 by Matsumura et al. teaches a method for the assembly of a display using semiconductor integrated circuits (ICs) affixed within the display for controlling pixel elements where the embedded transistors in the ICs replace the normal functions performed by the TFTs of prior art displays. Matsumura teaches that the semiconductor substrate should be thinned, for example by polishing, to a thickness of between 20 micrometers to 100 micrometers. The substrate is then diced into smaller pieces containing the integrated circuits, hereafter referred to as 'chiplets'. Matsumura teaches a method cutting the semiconductor substrate, for example by etching, sandblasting, laser beam machining, or dicing. Matsumura also teaches a pick up method where the chiplets are selectively picked up using a vacuum chuck system with vacuum holes corresponding to a desired pitch. The chiplets are then transferred to a display substrate where they are nested in a thick thermoplastic resin.

The process taught by Matsumura, however, has several disadvantages. First, semiconductor substrates are typically 500 micrometers to 700 micrometers in thickness. Thinning the substrate in this fashion is difficult and at low thicknesses, the crystalline substrate is very fragile and easily broken. Therefore the chiplets are very thick, at least 20 micrometers according to Matsumura. It is desirable that the chiplets have a thickness of less than 20 micrometers, and preferably less than 10 micrometers. It is also desirable to include multiple metal wiring layers in the chiplet, thus the thickness of the semiconductor portion of the chiplet must be substantially thinner than the total thickness of the chiplet. The thick chiplets of Matsumura result in substantial topography across the substrate, which makes the subsequent deposition and patterning of metal layers over the chiplets difficult. For example, Matsumura describes concave deformations as one undesirable effect. Thinner chiplets would reduce these topography problems and facilitate formation of the subsequent layers above the chiplets.

Another disadvantage of the process taught by Matsumura is that the surface area of the chiplets must be large enough to be picked up by the vacuum hole fixture. As a result, the chiplets must have a length and a width that are larger than the minimum size of the vacuum hole. It is desirable that the surface area of the chiplet be small to enable high resolution displays and so that many chiplets can be produced on a single substrate thereby enabling a low unit production cost. It is also desirable that the shape of the chiplet be made to fit between pixels and not block light emission. Therefore, the chiplet should have a length or width that is narrow compared to the other dimension so that it can be placed in the spacing between the rows or the columns of pixels.

A process of transferring transistor circuits is taught in U.S. Pat. No. 7,169,652 by Kimura. In this process, thin film transistors are formed and wired into circuits on a "transfer origin substrate" over a peeling layer. The circuits are then flipped over and attached to a display substrate. The circuits are released from the transfer origin substrate by light irradiation of the peeling layer. This arrangement can be called a "pad-down" configuration. Because the process of Kimura requires the circuits to be flipped over in a pad-down configuration, electrical connections between the circuit and wiring lines formed on the display substrate are made by "local formation" of a conductive adhesive layer between the circuits and the substrate.

The process of Kimura has several disadvantages. First, it is difficult to achieve high quality semiconductors since thin film layers of semiconductor must be formed over a release layer. It is desirable to use high quality crystalline semiconductors, such as that of a crystalline silicon wafer to achieve the best transistor performance. Second, this approach requires the additional cost of forming in isolated beads of conductive adhesive. Third, it is difficult to achieve a high yield of good quality electrical connections by aligning to the small beads of conductive adhesive. It is therefore desirable to avoid the need for patterned conductive adhesive.

SUMMARY OF THE INVENTION

It is an object of present invention to provide an improved method of producing an electroluminescent OLED display having chiplets driving elements where the chiplets are reduced in size and therefore cost. It is a further object of the present invention to reduce the thickness of the display having chiplets driving elements. It is a further object of this invention to provide ultra-thin chiplet driving elements which are interconnected to the OLED pixel elements using thin film metal deposition processes. This object is achieved by an electroluminescent device having a plurality of current driven pixels arranged in rows and columns disposed over a substrate, such that when current is provided to a pixel it produces light, comprising:

(a) each pixel having first and second electrodes and a current responsive electroluminescent media disposed between the first and second electrodes;

(b) at least one chiplet having a thickness less than 20 micrometers; including transistor drive circuitry for controlling the operation of at least four pixels, the chiplet being mounted on the substrate and having connection pads;

(c) a planarization layer disposed over at least a portion of the chiplet;

(d) a first conductive layer disposed over the planarization layer and connected to at least one of the connection pads of the chiplet; and (e) means for providing electrical signals through the first conductive layer and at least one of the connection pads of the chiplet so that the transistor drive circuitry of the chiplet controls current to the four pixels.

BRIEF DESCRIPTION OF THE DRAWINGS

FIG. 5 shows a layout view of a wafer containing chiplets prior to picking up the chiplets;

FIGS. 6A and 6B are cross sectional views along lines Y-Y' and Z-Z' of FIG. 5 respectively;

Since some device feature dimensions such as layer thicknesses are frequently in sub-micrometer ranges, the drawings are scaled for ease of visualization rather than dimensional accuracy.

DETAILED DESCRIPTION OF THE INVENTION

Figure 1:
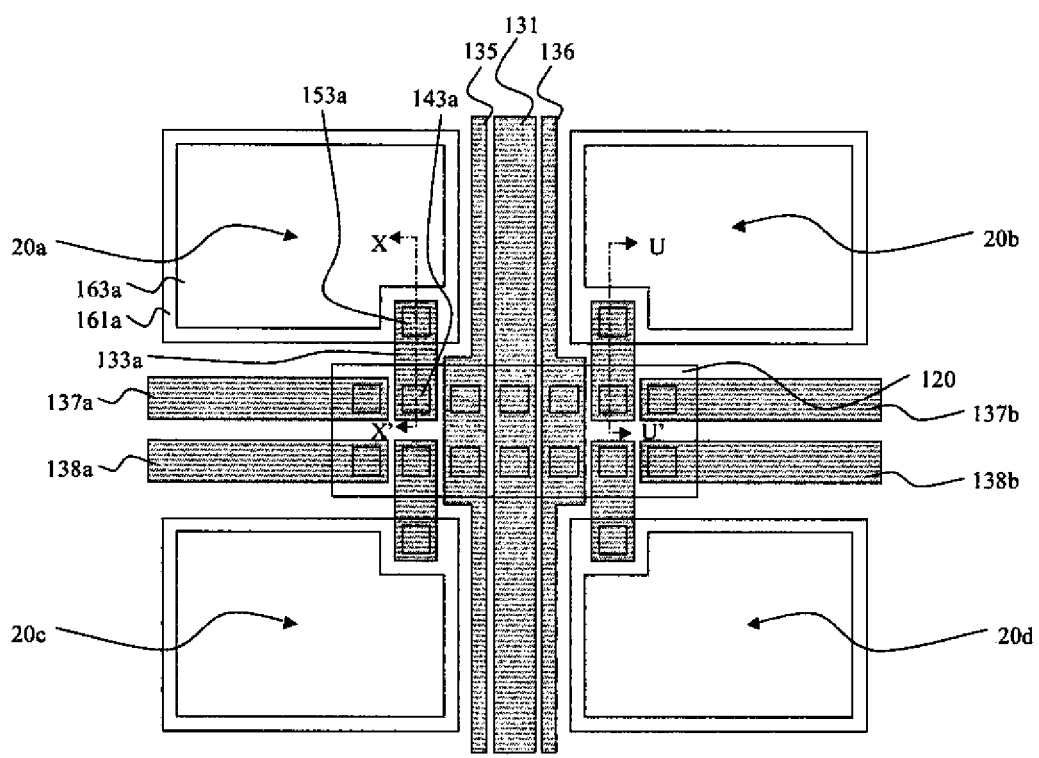
FIG. 1 is a layout view of four pixels of an OLED display according to the present invention.

FIG. 1 shows a layout view of a group of four pixels (20a, 20b, 20c and 20d) elements of an OLED display device according to the present invention. Each of the four pixels can be arranged to emit a different color, such as red, green, blue and white (RGBW). FIG. 1 represents a portion of a full display where the full display would be constructed of an array of such groups of pixels arranged in many rows and columns. For example, a modern television would be constructed having 1920 rows and 1080 columns of such groups of pixels.

A chiplet 120 is arranged to control the electrical current to pixels 20a, 20b, 20c and 20d. A chiplet is a separately fabricated integrated circuit which is mounted and embedded into the display device. Much like a conventional microchip (or chip) a chiplet is fabricated from a substrate and contains integrated transistors as well as insulator layers and conductor layers which are deposited and then patterned using photolithographic methods in a semiconductor fabrication facility (or fab). These transistors in the chiplet are arranged in a transistor drive circuit, as will be describe in more detail below, to drive the electrical current to pixels of the display. A chiplet is smaller than a traditional microchip and unlike traditional microchips, electrical connections are not made to a chiplet by wire bonding or flip-chip bonding. Instead, after mounting each chiplet onto the display substrate, deposition and photolithographic patterning of conductive layers and insulator layers continues. Therefore, the connections can be made small, for example through using vias 2 to 15 micrometers is size. As the chiplet and connections to the chiplet are small enough to be placed within the area of one or more pixels which, depending on the display size and resolution, range from approximately 50 micrometers to 500 micrometers in size. Additional details about the chiplet and its fabrication and mounting processes will be described in below.

Each pixel is provided with a lower electrode, such as a lower electrode 161a in pixel 20a. The emitting area of pixel 20a is defined by an opening 163a in an insulator formed over the lower electrode. The device includes multiple conductive elements formed in a first conductive layer which are arranged to facilitate providing electrical signals to the chiplet's transistor drive circuitry to enable the chiplet to control electrical current to the pixels. Chiplet 120 controls current to pixel 20a through a conductor 133a. For example, conductor 133a is connected to chiplet 120 through a via 143a and is also connected to lower electrode 161a through a via 153a. The device also includes a series of signal lines including, power lines, data lines, and select lines which are formed in the first conductive layer and transmit electrical signals from the edge of the display to the chiplets. Power lines are signal lines that provide a source of electrical current to operate the organic electroluminescent elements. Data lines are signal lines which transmit bright information to regulate the brightness of each pixel. Select lines are lines which selectively determine which rows of the display are to receive brightness information form the data lines. As such select lines and data lines are routed in an orthogonal manner.

Power is provided to the chiplet 120 by way of a power line 131. Two vias are provided for connection between the power line and the chiplet 120. A data line 135 is provided in the column direction for communicating a data signal containing brightness information to chiplet 120 for pixel 20a and pixel 20b. Similarly, a data line 136 is provided in the column direction for communicating a data signal containing brightness information to chiplet 120 for pixel 20b and pixel 20d. In an alternate embodiment, discussed in more detail below, the data lines 135 and 136 and the power line 131 can be connected to the chiplet 120 by only a single via for each line. A select line segment 137a is provided in the row direction for communicating a row select signal to chiplet 120 for pixel 20a and pixel 20b. The row select signal is used to indicate a particular row of pixels and is synchronized with the data signal for providing brightness information. Thus the row select signal and the data signals are provided in orthogonal directions. Chiplet 120 communicates the row select signal from select line segment 137*a* to a select line segment 137*b* by way of an internal pass-thru connection on the integrated circuit. Select line segment 137*b* then communicates the row select signal to subsequent chiplets arranged in the same row. Similarly a select line segment 138*a* is provided in the row direction for communicating a row select signal to chiplet 120 for pixel 20*c* and pixel 20*d*. Chiplet 120 communicates the row select signal from select line segment 138*a* to a select line segment 138*b* by way of another internal pass-thru connection on the integrated circuit. Select line segments 137*a* and 137*b* together serve to form a single select line, which is discontinuous. Connections between the select line segments is provided by the pass-thru connections in the chiplet. While only two segments are shown, the select line can contain a series of many such segments. Select line segments 138*a* and 138*b* similarly together serve to form a single discontinuous select line. In the preferred embodiment of the present invention, all of the select lines segments and data lines are formed from a single metal layer. Communication across the orthogonal array is then achieved by routing either the row select signal, the data signal, or both through the pass-thru connections on the chiplet.

Figure 2A:
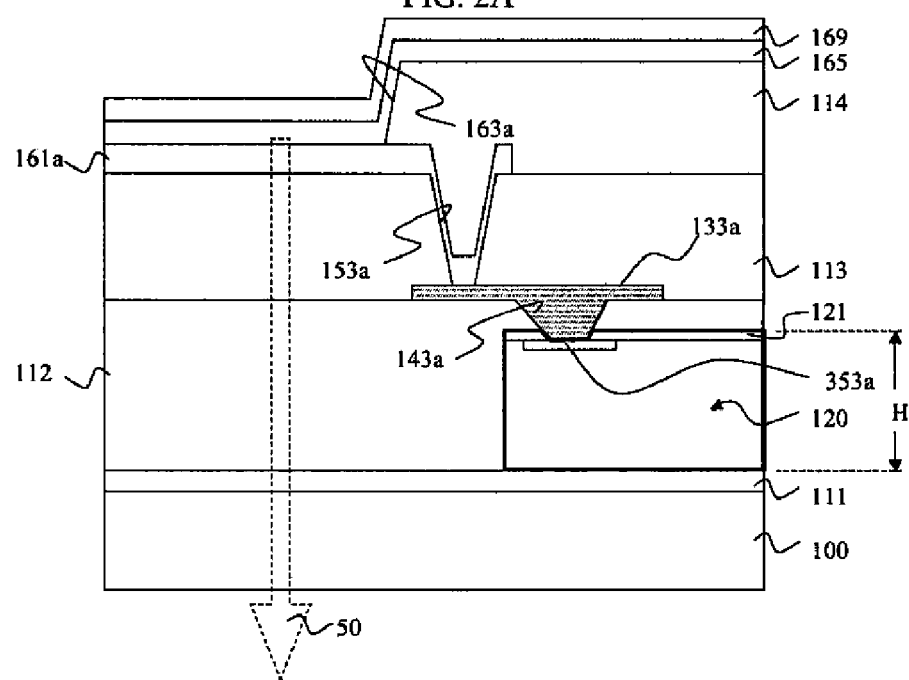
FIG. 2A is a cross-sectional view along line X-X' of the device of FIG. 1 in a pixel without a color filter.

FIG. 2A shows a cross sectional view of the OLED display device of FIG. 1 along line X-X', where pixel 20*a* is a white pixel, and thus needs no color filter. It can be seen that the device is constructed over a display substrate 100. Over display substrate 100, an adhesive layer 111 is provided. One preferred material for adhesive layer 111 is Benzocyclobutene (BCB), formed by spin coating to thickness of approximately 0.5 to 10 micrometers. Chiplet 120 is placed in the adhesive layer 111. The chiplet has a thickness (H), which is preferably less than 20 micrometers and more preferably less than 10 micrometers. Planarization layer 112 is provided to reduce the topography around chiplet 120 and facilitate continuous formation of a subsequent conductive layer. A planarization layer 112 is preferably formed at a thickness greater than the thickness (H) of the chiplet 120. A useful material for planarization layer 112 is Benzocyclobutene (BCB) formed by spin coating. It is particularly advantageous to use the same material for the adhesion layer 111 and the planarization layer 112 so as to reduce differences in refractive index that can cause optical reflections at the interface of these two layers. Therefore by using the same material, the refractive index of the adhesion layer 111 and the planarization layer 112 layers are the same. Via 143*a* is opened in the planarization layer 112 and an optional insulator sub-layer 121 on chiplet 120 to provide access to a connection pad 353*a*. Formation of this via can be done using photolithography techniques and is facilitated if a photo-imagable BCB compound is used for planarization layer 112. Chiplet 120 is mounted over substrate 100 such that the connection pads, such as connection pad 353*a*, are facing upward. The arrangement can be called a "pad-up" configuration. In particular, the transistor circuitry in the chiplet (not shown) is disposed between the connection pads and the substrate 100. This arrangement is advantageous in that it provides convenient access to the connection pads for subsequent wiring layers.

Over planarization layer 112, a conductor layer (or wiring layer) is formed. This conductor layer is then patterned using conventional photolithography techniques into the select lines, data lines, and power lines, as well as the connectors between the chiplets and the anodes, such as conductor 133*a*. Electrical connection between the conductor layer and the chiplet 120 can then be readily made through vias, such as via 143*a*. This enables high quality, reliable electrical connectivity. Since the current to the pixels is provided by the wiring layer, it is preferred that this layer be constructed to have low resistance. In this regard, preferred materials for this layer include aluminum or aluminum alloys formed to a thickness of approximately 200 to 500 nm. Over this wiring layer, an insulator layer 113 is formed. Vias, such as via 153*a*, provide for connection to the wiring layer from above. Lower electrode 161*a* is provided over insulator layer 113. In this bottom emitter configuration, lower electrode 161*a* is made to be at least partially transparent. Useful materials include transparent conductive oxides such as Indium Tin Oxide (ITO) or Aluminum doped Zinc Oxide (AZO) or the like. Thin metals such as less than 25 nm of aluminum, silver, or the like can also be used. Over the edges of lower electrode 161*a*, an insulator layer 114 is formed. This insulator layer 114 can be constructed, for example, of a photo-patterned polymer and serves to prevent high electric fields at the edges of the lower electrode 161*a*. Similar insulator layers for this purpose are described in U.S. Pat. No. 6,246,179. Opening 163*a* is provided in the insulator layer to provide for contact to the lower electrode 161*a*.

Above lower electrode 161*a*, an organic electroluminescent medium 165 is formed. There are many different organic electroluminescent media configurations known in the art that can be successfully applied to the present invention by one skilled in the art. Although the organic electroluminescent medium 165 is shown as a single layer, it preferably includes a plurality of sub-layers such as a hole transporting sub-layer and an electron transporting sub-layer. Organic electroluminescent medium 165 can include additional sub-layers such as hole injecting sub-layers, electron injecting sub-layers, or specialized light emitting sub-layers. For the organic electroluminescent media 165, a common broadband (or white) light source which emits light at all the various wavelengths used by all the differently colored pixels is preferably used to avoid the need for patterning the organic electroluminescent media between light producing units. Colored pixels are achieved by aligning color filter elements with light producing elements. Some examples of organic EL media layers that emit broadband or white light are described, for example, in U.S. Pat. No. 6,696,177. However, the present invention can also be made to work where each pixel has one or more of the organic electroluminescent media sub-layers separately patterned for each pixel. The organic EL media is constructed of several sublayers such as; a hole injecting sublayer, a hole transporting sublayer that is disposed over the hole injecting sublayer, a light-emitting sublayer disposed over the hole transporting sublayer, and an electron transporting sublayer disposed over the light-emitting sublayer. Alternate constructions of the organic electroluminescent media 165 having fewer or more sublayers can also be used to successfully practice the present invention.

Over organic electroluminescent medium 165, an upper electrode 169 is formed. Although shown as a single layer, upper electrode 169 can also include a plurality of sub-layers. Several upper electrode configurations are known in the art and can be applied to the present invention by one skilled in the art. One configuration for upper electrode 169 includes a sub-layer of Li or LiF approximately 0.5 nm thick in contact with the organic electroluminescent medium 165 for facilitating electron injection followed by a sub-layer of Al approximately 100 to 400 nm thick. Other features such as a moisture barrier encapsulation (not shown) or desiccant (not shown) commonly used in the art of fabricating OLED devices can also be included. Current flow between the lower electrode 161a and the upper electrode 169 through the organic electroluminescent medium 165 results in light emission 50.

Figure 2B:
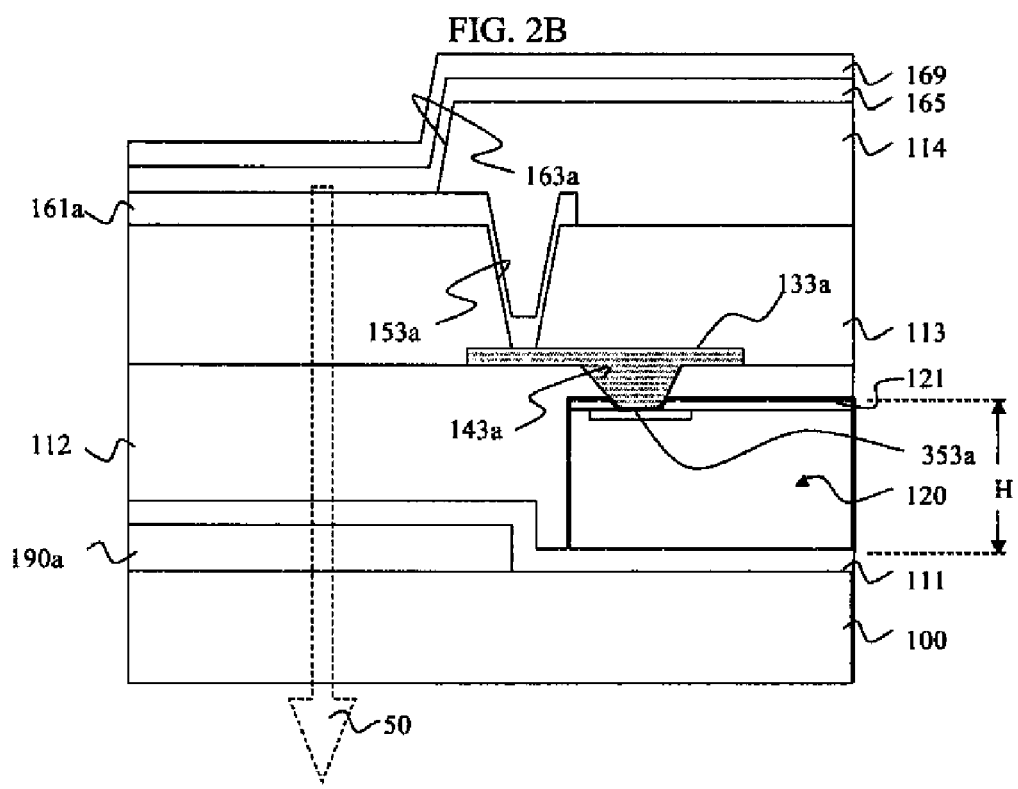
FIG. 2B is a cross-sectional view along line U-U' of the device of FIG. 1 in a pixel where a color filter is used.

FIG. 2B shows a cross sectional view of the OLED display device of FIG. 1 along line U-U', where pixel 20b has a colored filter. A color filter 190a is placed under the light emitting area, and can be deposited before the adhesive layer 111 as shown. In an alternative embodiment the color filters can be placed on top of the adhesive. For an RGBW type display, the white pixels are can be constructed without color filters. Color filters can be formed by methods such as spin coating and are approximately 1 to 3 micrometers in thickness. It is preferred that the color filter be placed under the planarization layer 112 so that the planarization layer serves to planarize both the color filters and the chiplet 120. It is preferred that the color filters are formed prior to mounting the chiplets. Since the chiplets are relatively thick, their presence can impair proper spin coating of the color filters, so that device performance and yield are enhance by stamping the chiplets after forming the color filters. Furthermore, the color filters process can be inspected and defective devices discarded prior to placing the chiplets so as to reduce the chance of wasting chiplets, thereby reducing overall production cost.

Figure 3A:
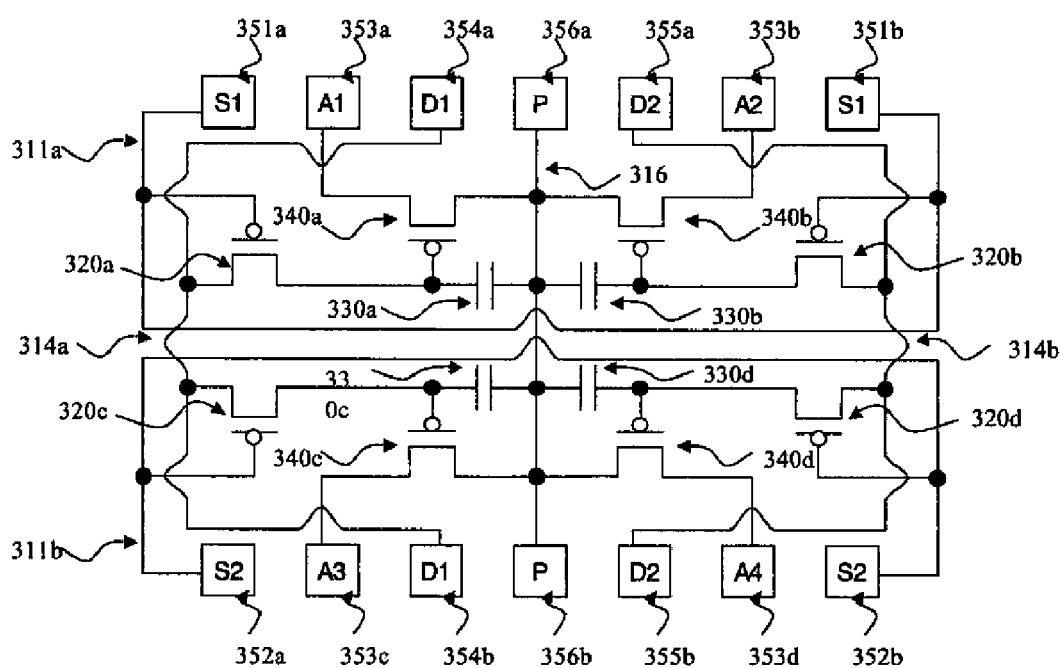
FIG. 3A is a circuit schematic of the integrated circuit chiplet according to the present invention.

FIG. 3A illustrates a schematic drawing of an integrated circuit 300 provided on each chiplet according to the present invention. Integrated circuit 300 is arranged to drive four independent OLED pixel elements. Integrated circuit 300 includes four select transistors (320a, 320b, 320c and 320d), four storage capacitors (330a, 330b, 330c and 330d) and four drive transistors (340a, 340b, 340c and 340d). Other circuits with more or less components can also be employed to successfully practice the present invention. These components are connected to several connection pads arranged in two rows including connection pads 351a, 351b, 353a, 353b, 354a, 355a and 356a arranged in a first row and connection pads 352a, 352b, 353c, 353d, 354b, 355b and 356b arranged in a second row. Connections pads 353a, 353b, 353c and 353d are provided for connection to the lower electrode (anode) of the organic light emitting diode element of each pixel. These connection pads are electrically connected to drive transistors 340a, 340b, 340c and 340d respectively. Connection pads 356a and 356b are arranged for connection to an external power supply line, are electrically connected by pass-thru connection 316 and are electrically connected to all of the drive transistors 340a, 340b, 340c and 340d. Connection pads 351a and 351b are arranged for connection to a first external select line, are electrically connected by a pass-thru connection 311a and are electrically connected to the gates of select transistors 320a and 320b. Connection pads 352a and 352b are arranged for connection to a second external select line, are electrically connected by pass-thru connection 311b and are electrically connected to the gates of to select transistors 320c and 320d. Connection pads 354a and 354b are arranged for connection to a first external data line, are electrically connected by a pass-thru connection 314a and are electrically connected to select transistors 320a and 320c. Connection pads 355a and 355b are arranged for connection to a first external data line, are electrically connected a by pass-thru connection 314b and are electrically connected to select transistors 320b and 320d.

In order for the external select lines to address the rows of pixels of the display and the external data lines to address the columns of the display these lines must be arranged in an orthogonal pattern. It is desirable that these external lines be formed from a single metal layer to avoid additional manufacturing steps. This is achieved by routing either the data signal or the select signal through the pass-thru connections on the chiplet. In the case shown, the select signals, the data signals, and the power signal are all provided with pass-thru connections. The external select lines are discontinuous and require the pass-thru connections to complete the connection. The external data lines and power lines however are continuous. In this case, providing two connection pads with a pass-thru connection for each of the two data signals and power signals has an advantage of redundancy. That is, if one of the connections between the connection pad and the external data lines or the external power lines is not fully formed or is otherwise incomplete, the device will continue to function.

Figure 3B:
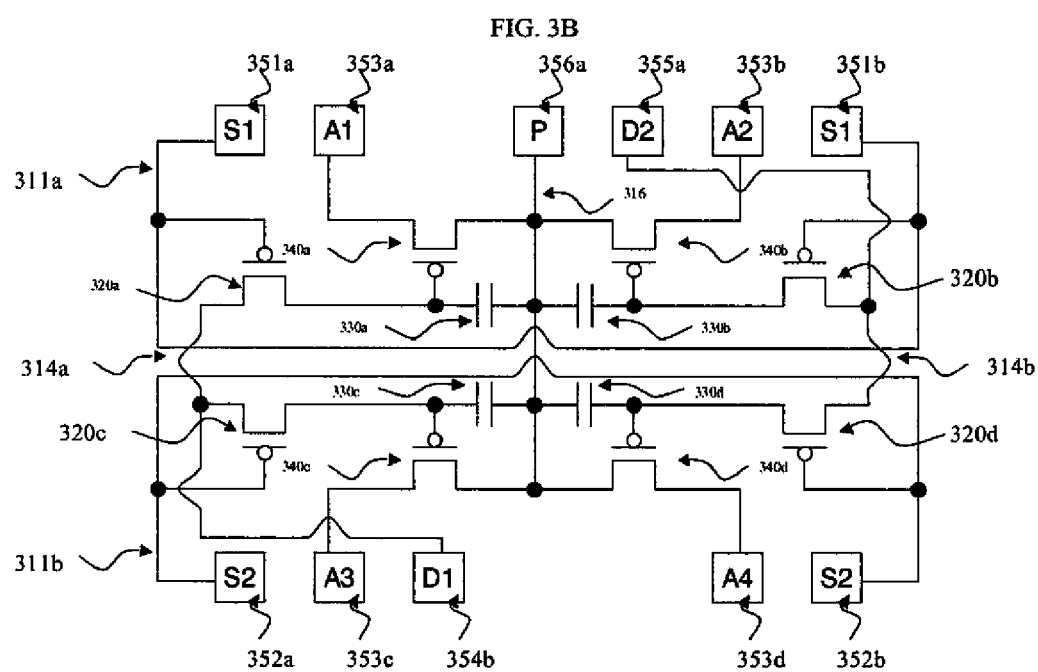
FIG. 3B is a circuit schematic of the integrated circuit chiplet according to an alternate embodiment of the present invention.

In alternate embodiments of the present invention, pass-thru connections can be provided for only the select signal and not the data signal or vice versus. The pass-thru connection for the power signal can also be optionally eliminated. In addition to removing the pass-thru connections, one of the two connection pads associated with each of the removed pass-thru connections can also be removed. One such alternate embodiment is shown in FIG. 3B. This alternate embodiment has an advantage that surface area of the chiplet needed for circuitry and connection pads is reduced. However, this alternate embodiment losses the advantage of redundant connections for the data signal and power signal.

FIG. 1 to FIG. 3B show the preferred embodiment where the chiplet drives four pixels where the four pixels includef pixels that emit red, green, blue, and white light. In an alternative embodiment, the chiplet could drive a different number of pixels—for example eight, twelve or sixteen. For example, a chiplet controlling sixteen pixels including 4 red, 4 green, 4 blue and 4 white subpixels can be constructed. It is preferable that the chiplet drive an equal number of each different color subpixels, such as N red subpixels, M green subpixels, P blue subpixels, and Q white subpixels where N=M=P=Q such that N is an integer equal to 2 or more. This arrangement provides an advantage since each differently colored pixel can require different driving currents due to different color efficiencies, the transistor design (such as the channel ratio of the channel width to channel length) can be separately optimized for each different color.

Thus there is an advantage in display designs where each chiplet drives an equal number of pixels of each color such that all chiplets can be made the same. Such arrangements also facilitate the placing of the chiplets symmetrically within the display area.

Figure 4:
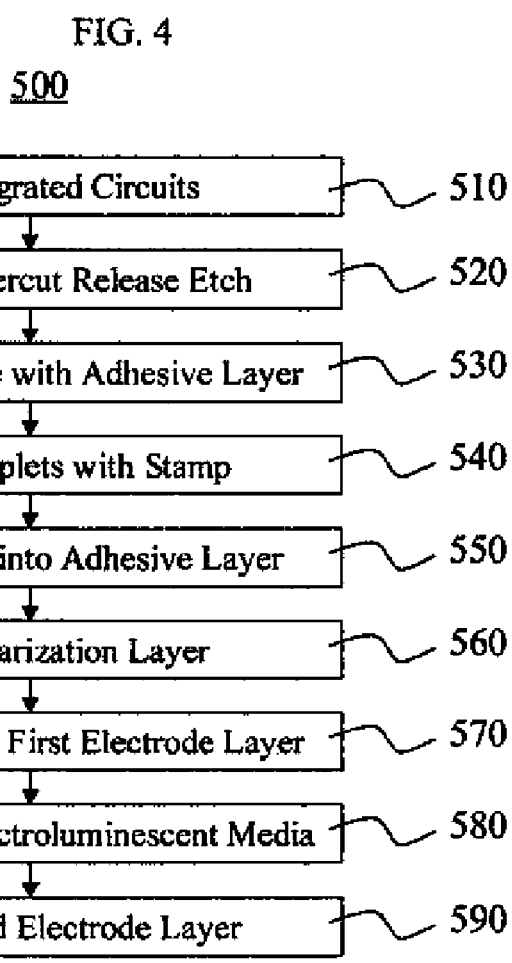
FIG. 4 is a block diagram illustrating the process for forming a OLED display with chiplet driving circuitry.

FIG. 4 is a block diagram describing the process steps for making an OLED display according to the present invention. The process 500 begins with step 510 by forming integrated circuits. These integrated circuits are arranged in a configuration to drive one or more pixels of the OLED display. The integrated circuit is preferably formed from a silicon-on-insulator type (SOI) substrate using conventional, known integrated circuit fabrication techniques. Preferred SOI substrates include a crystalline silicon layer formed over an insulator layer, such as silicon dioxide, which is in turn formed over a bulk crystalline silicon wafer. The silicon dioxide layer is commonly referred to as the "buried oxide" or "BOx". There are a variety of methods known in the art for producing SOI wafers. Some of these methods including bonding a first silicon wafer with a silicon dioxide layer to a second silicon wafer followed by cleaving or thinning the second silicon wafer such that a thin film of crystalline silicon remains over the silicon dioxide layer. Such SOI wafers are commercially available from a variety of suppliers. Also, integrated circuits formed on SOI substrates useful for practicing the present invention can also be purchased from a variety of commercial suppliers, known as foundries. For purposes of this invention, this substrate used for forming the integrated circuit for the chiplets is hereafter referred to as the "integrated circuit substrate".

In step 520, a release etch is formed to partially separate the chiplets from the integrated circuit substrate. This step is further illustrated in the layout view of the chiplet partially attached to the integrated circuit substrate shown in FIG. 5 and cross sectional views of FIG. 6A and FIG. 6B. FIG. 6A is a cross sectional view from FIG. 5 along line Y-Y' and FIG. 6*b* is a cross sectional view from FIG. 5 along line Z-Z'. Chiplet 120 is formed from an integrated circuit substrate which is of the silicon on insulator type. The silicon on insulator substrate consists of a semiconductor layer 605, preferable less than 10 micrometers in thickness and more preferably between 0.05 and 5 micrometers in thickness, separated from an integrated circuit substrate bulk 601 by a buried oxide with a thickness of between 0.1 to 3.0 micrometers. In the area of the chiplet, the semiconductor layer contains the semiconductor portions, including doped regions and wells, used in forming the source and drain regions of the transistors. Over the semiconductor layer, circuitry layers 670 are formed which contain chiplet-conductor sub-layers, such as a chiplet-conductor sub-layer for forming gate electrodes and one or more chiplet-conductor sub-layers serving to form electrical connections between the transistors. Circuitry layers 670 include the connection pads, such as connection pads 353*b*, 353*d*, 354*a* and 354*b* formed in one of chiplet-conductor sub-layer.

Figure 7:
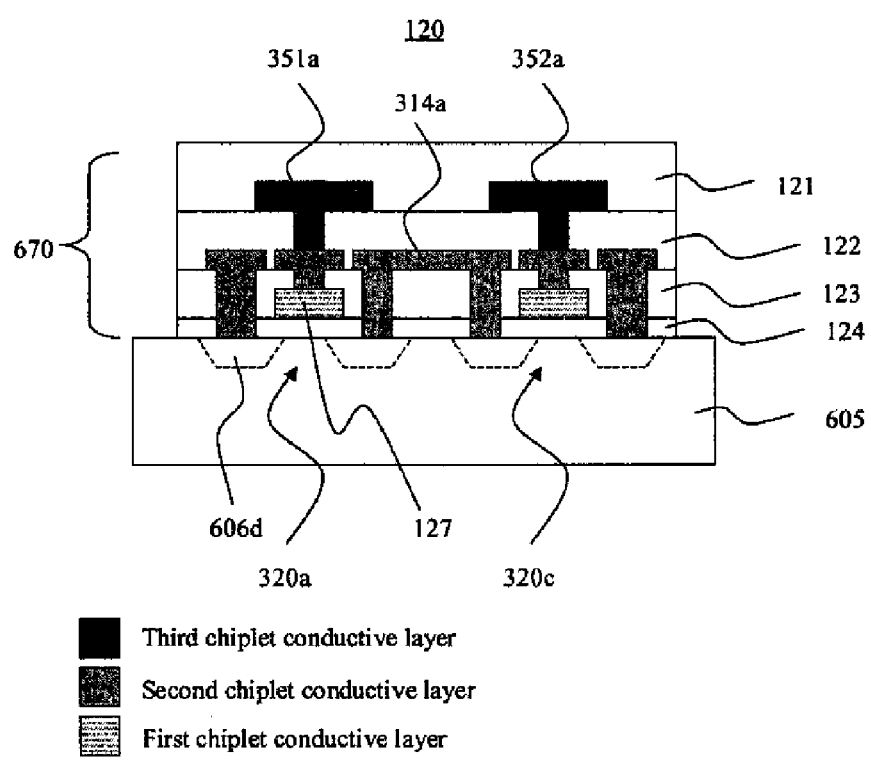
FIG. 7 is detailed cross-sectional view of a chiplet according to the present invention.

The circuitry layers 670 and semiconductor layer 605 are further illustrated in the cross-sectional view of the chiplet 120 shown in FIG. 7. The circuitry layers 670 also include several insulator sub-layers such as a gate insulator sub-insulator 124 and interlayer insulator sub-layers 123, 122, and 121. These insulator sub-layers can be constructed of materials such as silicon dioxide or other known insulator materials. The chiplet also includes a plurality of chiplet-conductor layers. The first chiplet-conductor layer is arranged to form gate electrodes, such as a gate electrode 127. Doped regions in semiconductor layer 605, such as a doped region 606*d*, form sources and drains of transistors corresponding to the gate electrodes. A second chiplet conductor layer is provided for forming connections between transistors, such as the pass-thru connection 314*a*. The connection pads, such as connection pads 351*a* and 352*a*, are preferably formed in a third chiplet-conductor layer. This preferred configuration permits efficient layout of the wiring in the second chiplet-conductor layer while permitting dense packing of connection pads in the third chiplet-conductor layer. However, in alternate embodiments fewer or more chiplet-conductor layers can be employed. The thickness of the circuitry layers 670 depends on the number of chiplet-conductor sub-layers and is preferably between 1 micrometer and 15 micrometers. The total thickness of the chiplet (H) is then combination of the thickness of the semiconductor layer 605 and the circuitry layers 670 and is preferably less than 20 micrometers.

Turning back to FIGS. 6A and 6B, trenches, such as a trench 640, are formed around each chiplet, such as chiplet 120. These trenches are etched through the semiconductor layer 605, exposing the buried oxide layer. Anchor areas, such as anchor area 620, are provided between chiplets. The chiplets are attached to the anchor areas by small microbridges, such as microbridge 610 as described in U.S. patent application Ser. No. 11/421,654. Prior to forming the trenches, a protection layer (not shown) of a material such as a photoresist or silicon nitride layer is formed over the integrated circuitry as described in U.S. Patent Application Publication No. 2008/0108171. A release etch is then performed using an etchant such as hydrofluoric acid (HF) to remove the portion of the buried oxide layer disposed under the chiplet and microbridges, leaving a buried oxide portion 630 under the anchors. The protection layer can then removed, exposing the chiplet connection pads. Chiplet 120 has a width (W) and length (L). The anchor area 620 has a width (I) which is preferably greater than W to permit the buried oxide to be complete removed from under the chiplet while not completely etching the buried oxide under the anchor leaving buried oxide portion 630.

Turning back to FIG. 4, adhesion layer 111 is applied to the display substrate 100 in step 530. The adhesive can be BCB or other common photoresist materials as described above.

Figure 8:
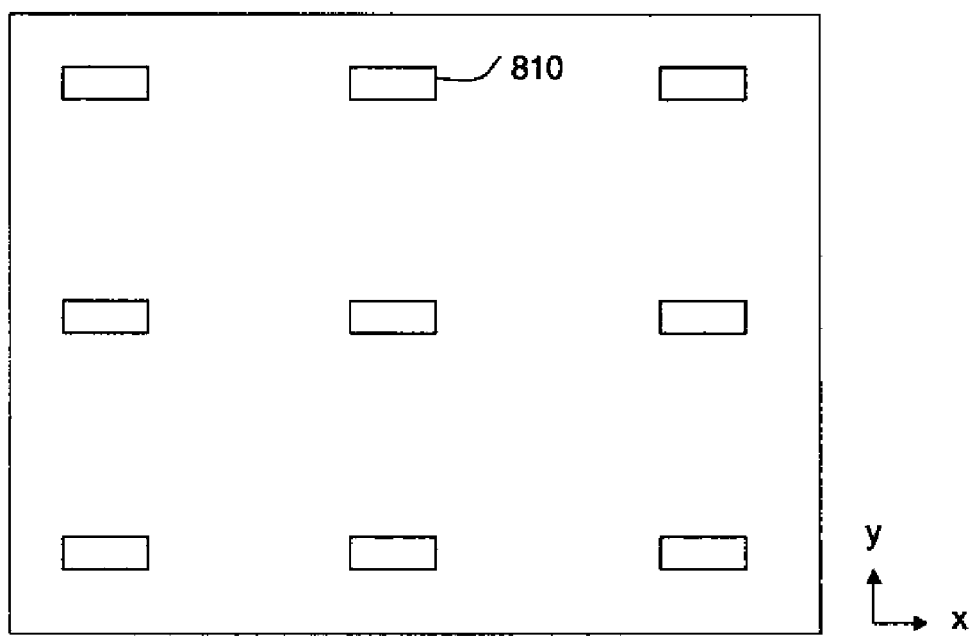
FIG. 8 is a plan view of the stamp used to pick up and transfer the chiplets.
Figure 9:
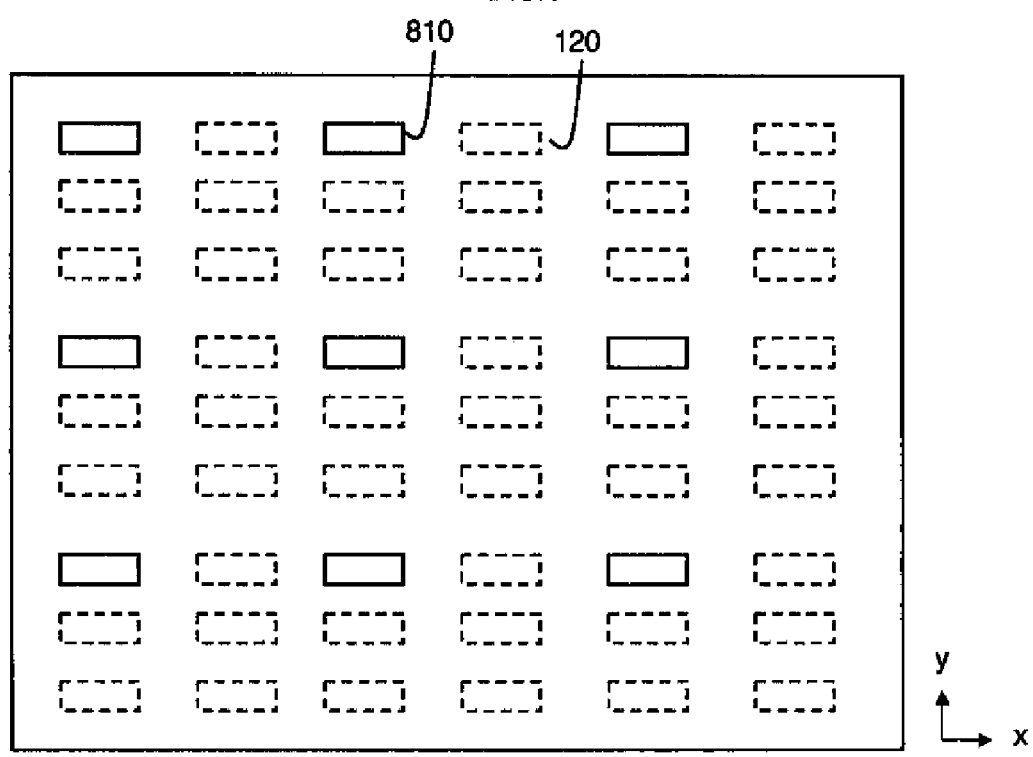
FIG. 9 is a plan view of the chiplet stamp over the chiplets on the semiconductor substrate.

The chiplets are picked up in step 540 with a stamp as described in U.S. patent application Ser. No. 11/145,574. The stamp is preferably constructed of a conformable material such as poly(dimethyl siloxane) (PDMS) that has its undersurface formed into posts. An example stamp 800 is shown in FIG. 8. Stamp 800 contains a variety of raised posts, such as post 810. The spacing of the posts is predetermined to be a geometric multiple (integer or integer ratio) of the spacing of the chiplets on the integrated circuit substrate as well as the pixels spacing on the display substrate. For example, the alignment of the stamp to the chiplets to the integrated circuit substrate is shown in FIG. 9 where the posts correspond to every second chiplet (such as chiplet 120) in the x direction and every fourth chiplet in the y direction. The posts on the stamp pad can pick up a portion of the chiplets in one stamping operation. Multiple stamping operations can then be used to populate the entire display with chiplets. This has the advantage that due to the area of high utilization efficiency of the integrated circuit substrate area, the integrated circuit substrate area can be much smaller than the area of the display. In the pickup operation, the stamp is aligned so the posts 810 are located over the chiplets 120. The chiplets are then quickly detached from the silicon on insulator substrate. As described in U.S. patent application Ser. No. 11/423,192, kinetic control of the adhesion forces between the stamp and the chiplets enable the controlled fracture of the supporting microbridges 610. The van de Waal's force between the stamp and the chiplet causes the chiplets to remain in contact with the stamp after the microbridges are broken. This method of picking up the chiplets enables the chiplets to be very small in area. For example, a chiplet with length or width dimensions of 50 micrometers or less can be ready picked up using this method. Such dimensions are difficult to achieve using a vacuum suction apparatus as the vacuum suction opening must be smaller than the chiplet dimension. This technique also permits large arrays of such chiplets to be simultaneously transferred while maintaining good dimensional spacing and alignment between the chiplets.

In step 550, the stamp with the chiplets is aligned to the target location on the display substrate 100 and lowered so the chiplets 120 are in contact with the adhesion layer 111. The bond with the adhesive is stronger than the van de Waal's force so the chiplets remain on the display substrate. The stamp is then withdrawn, leaving the chiplets adhered to the display substrate. The adhesive can then be cured. Optionally, the adhesive can also be removed in areas not under the chiplet. At this stage the chiplets are effectively mounted to the display substrate.

In step 560, the planarization layer 112 is applied to the substrate, covering the chiplets. The BCB layer is preferably greater in thickness than the chiplets, which is beneficial in reducing overall topography (variations in surface height) on the display substrate. The planarization layer is patterned to open the vias, such as via 143*a* over the chiplet as described above. In the preferred embodiment, the planarizing material is itself a photo resist material, such as photoimagable BCB, that can be used also as a mask to permit etching of the insulating sub-layer 121 on the chiplet 120 in order to expose the metal connection pads, such as connection pad 353a in the chiplet. At this stage, the chiplet is effectively embedded in the display device.

In step 570, a conductor layer is deposited over top of the planarization layer, and then the metal layer is patterned to form wires. Standard photolithography methods and etching can be used to pattern the wires. Alternatively the metal layer can be deposited in a pattern-wise fashion using methods such as ink-jet deposition of silver nano-particles.

In the case of a bottom emission OLED display, a transparent lower electrode 161a is required. One approach to form such a patterned electrode is to deposit another insulator layer 113 of photoresist and to open vias exposing for connection to the underlying metal layer, e.g. 153a. The transparent lower electrode 161a is then deposited, for example by sputtering, using a common transparent conductive oxide such as ITO or IZO. This is patterned using standard etching methods. Alternative transparent electrode materials exist including conductive polymeric materials such as PDOT/PSS copolymers. In the alternative embodiment of a top-emission display, the patterned conductor layer could be used to form the reflective lower electrodes, eliminating the need for a separate conductor layer and inter-layer insulator layer 113.

The emission areas of each pixel are defined by opening 163a in insulator layer 114 that can be formed of a photoimagable material.

In step 580, the electroluminescent media 165 layers of materials is formed. In the preferred embodiment these are small molecule materials and a typical stack contains layers for hole injection, hole transport, recombination and light emission, electron transport and electron injection. Multiple stack can also be used with connecting layers. A preferred method of forming the organic electroluminescent media layers is by evaporation from a crucible or linear evaporation source. Alternatively these materials can be polymeric and deposited by methods known in the art such a spin coating or inkjet coating.

In step 590, the upper electrode 169 is formed. In the preferred embodiment this electrode is not patterned in the pixel area but is continuous and electrically common across all the pixels. The upper electrode can be deposited by evaporation or sputtering. For a bottom emitting configuration, preferred materials include aluminum, a stack of aluminum over lithium or lithium fluoride, or magnesium silver alloys. In an alternate top emitting embodiment, the upper electrode can be made to be transparent using materials such as transparent conductive oxides like ITO or thin metals such as less than 25 nm of aluminum or silver. The circuit in the chiplet serves to regulate the current flowing vertically through the OLED stack between lower electrode 161a and upper electrode 169, producing the light emission 50 at desired intensities.

FIG. 5 shows a plan view of the chiplets 120 on the mother wafer prior to pickup in step 540. After etching to release the chiplets in step 520, the chiplets remain attached by microbridges 610. The rows of chiplets are separated by the anchor area 620 that remain attached to the substrate below the etched layer. A cross section of the chiplet through Y-Y' in FIG. 5 is shown in FIG. 6A and a cross section through Z-Z' is shown in FIG. 6B. The buried oxide portion 630 is completely removed from under the chiplet 120 but partially remains under the anchor area. The microbridges 620 mechanically support the chiplet after the etching is complete.

As previously described and further illustrated in FIG. 5, each chiplet has connection pads arranged in two rows including connection pads 351a, 351b, 353a, 353b, 354a, 355a and 356a arranged in a first row and connection pads 352a, 352b, 353c, 353d, 354b, 355b and 356b arranged in a second row. The rows are arranged parallel to the length (L) direction. It is desirable that the width (W) be made small in order to facilitate the release etch. Therefore it is preferable that the chiplet be constructed with either one or two rows of vias. The transistor and wiring circuitry within the chiplet can be fabricated using currently available semiconductor patterning technology. For example, semiconductor fabrication facilities can process feature sizes of 0.5 micrometers, 0.35 micrometers, 0.1 micrometers, 0.09 micrometers, 0.065 micrometers, or smaller. The size of the pads, however, is determined by the alignment and feature sizes of the metallization layers formed on the display substrate and is relatively large. For example, line, space, and via sizes of 5 micrometers with alignment accuracies of +/−5 micrometers would be compatible with chiplet connection pads that were 15 micrometers on a side (S) and spaced at 20 micrometers in pitch (P). Therefore, in the present embodiment of the invention, the overall size of the chiplet is dominated by the size and arrangement of the connection pads. It is desirable that the size of the chiplet be made small so that many chiplets can be made simultaneously on the same integrated circuit substrate.

The connections to the chiplets made on the display substrate are shown in FIG. 1. It is desirable that the surface area of the display substrate covered by the chiplet and the wiring be made small so that the surface area available for emission of the pixels is large. In order to facilitate the connections to the chiplet while keeping the surface area of the wiring small, the arrangement of the connection pads on the chiplets is specifically selected. For example, the connection pads associated with the select line segments (137a, 137b, 138a, 138b) are arranged at the ends (first and last) of each row of connections pads. This avoids the need to bend the select line segments which can then be made small.

The data lines 135 and 136 are routed in a direction perpendicular to that of the select lines segments. In a preferred arrangement shown in FIG. 1, the data lines pass over the chiplet 120 in a continuous fashion. As such, it is desirable that the chiplet 120 be arranged so that is shorter width (W) dimension be aligned parallel to direction of the data lines. The longer length (L) direction is therefore preferably aligned parallel to the select lines. The power line 131 is also preferably routed in a continuous fashion in a direction perpendicular to that of the select lines segments and parallel to the shorter width (W) dimension of the chiplet 120. These layout arrangements result in a large portion of the area of the chiplet under the signal lines being that of the connection pads and reduces wasted non-connection pad areas covered by the signal lines so that the chiplet can be made small and the surface area of the display substrate covered by the chiplets can also be made small. It is also preferably the power line be arranged so as to be centered over the chiplet as shown to simplify wiring to the pixels on each side of the power line.

Figure 10:
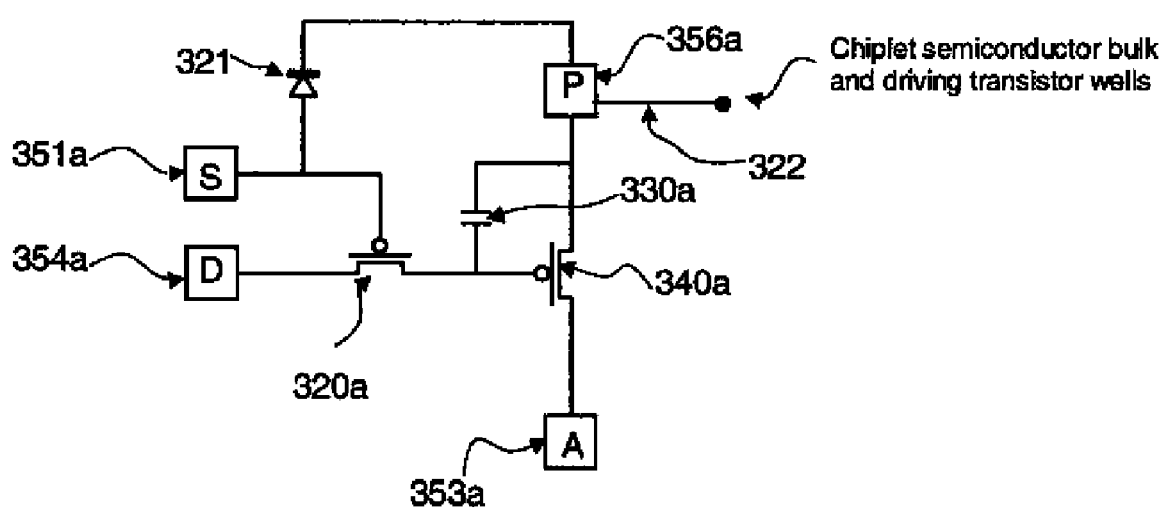
FIG. 10 shows the Electro Static Damage prevention circuit diagram.

A pixel drive circuit of an alternate embodiment useful for protecting against electrostatic damage is shown in FIG. 10. Multiple pixel drive circuits can be included on the chiplet to drive multiple pixels. The pixel drive circuit consists of a drive transistor 340a, a select transistor 320a, a storage capacitor 330a and a diode 321 for electrostatic discharge (ESD) protection. In the configuration shown all the transistors are p-mos and only a single power connection pad 356a is needed. If CMOS transistors were used then another power connection would be required which would add additional wiring in the panel. The power connection pad 356*a* is connected to the doped well regions of the semiconductor bulk corresponding to transistors 320*a* and 330*a* and also to the semiconductor bulk of the chiplet through connections 322. The ESD diode 321 is connected to connection pad 351*a* and power connection pad 356*a*. It provides protection for the gate of select transistor 320*a* from voltage transients in manufacturing of the chiplet, during printing of the chiplet, during manufacturing of the display and during operation.

The invention has been described in detail with particular reference to certain preferred embodiments thereof, but it will be understood that variations and modifications can be effected within the spirit and scope of the invention.

PARTS LIST

20*a* white pixel
20*b* pixel with color filter
20*c* pixel
20*d* pixel
50 light emission
100 display substrate
111 adhesion layer
112 planarization layer
113 insulator layer
114 insulator layer
120 chiplet
121 insulator sub-layer
122 insulator sub-layer
123 insulator sub-layer
124 insulator sub-layer
127 gate electrode
131 power line
133*a* conductor
135 data line
136 data line
137*a* select line segment
137*b* select line segment
138*a* select line segment
138*b* select line segment
143*a* via
153*a* connection pad
161*a* lower electrode
163*a* opening
165 organic electroluminescent medium
169 upper electrode
190*a* color filter
300 integrated circuit
311*a* pass-thru connection
311*b* pass-thru connection
314*a* pass-thru connection
314*b* pass-thru connection
316 pass-thru connection
320*a* select transistor
320*b* select transistor
320*c* select transistor
320*d* select transistor
321 ESD protection diode
322 connection to well and chiplet substrate
330*a* storage capacitor
330*b* storage capacitor
330*c* storage capacitor
330*d* storage capacitor
340*a* drive transistor
340*b* drive transistor
340*c* drive transistor
340*d* drive transistor
351*a* connection pad
351*b* connection pad
352*a* connection pad
352*b* connection pad
353*a* connection pad
353*b* connection pad
353*c* connection pad
353*d* connection pad
354*a* connection pad
354*b* connection pad
355*a* connection pad
355*b* connection pad
356*a* connection pad
356*b* connection pad
500 process
510 step
520 step
530 step
540 step
550 step
560 step
570 step
580 step
590 step
601 integrated circuit substrate bulk
605 semiconductor layer
606*d* doped region
610 microbridge
620 anchor area
630 buried oxide portion
640 trench
670 circuitry layers
800 stamp
810 posts

The invention claimed is:

1. An electroluminescent device having a plurality of current driven pixels arranged in rows and columns disposed over a substrate, such that when current is provided to a pixel it produces light, comprising:
    (a) each pixel having first and second electrodes and a current responsive electroluminescent media disposed between the first and second electrodes;
    (b) at least one chiplet having a thickness less than 20 micrometers and including transistor drive circuitry for controlling the operation of at least four pixels, the chiplet being mounted on the substrate and having connection pads;
    (c) a planarization layer disposed over at least a portion of the chiplet;
    (d) a first conductive layer disposed over the planarization layer and connected to at least one of the connection pads of the chiplet; and
    (e) means for providing electrical signals through the first conductive layer and at least one of the connection pads of the chiplet so that the transistor drive circuitry of the chiplet controls current to the four pixels.

2. The electroluminescent device of claim 1, wherein the first electrode is formed in a second conductive layer that is different than the first conductive layer.

3. The electroluminescent device of claim 2, further includes an insulator layer disposed between at least a portion of the first electrode and the first conductive layer.

4. The electroluminescent device of claim 2, wherein the first electrode is connected to the chiplet by the first conductive layer.

5. The electroluminescent device of claim 1, wherein the first electrode is formed in the first conductive layer.

6. The electroluminescent device of claim 1, wherein the chiplet is attached to the substrate by an adhesive layer, and the adhesive layer and the planarization layer have the same refractive index.

7. The electroluminescent device of claim 1, further includes a power supply line, one or more data signal lines, and one or more select lines which are formed in the first conductive layer and connected to corresponding connection pads on the chiplet.

8. The electroluminescent device of claim 7, wherein the chiplet further comprises an electrical pass-thru connection, and wherein either the select line or data signal line is discontinuous and connected to the electrical pass-thru connection in the chiplet.

9. The electroluminescent device of claim 1, wherein the chiplet has a width and a length that is greater than the width, and the connection pads of the chiplet are arranged in a first and second row along the direction of the length.

10. The electroluminescent device of claim 9, further includes a signal line which is discontinuous and connected to the first and last connection pads in each row of connection pads of the chiplet.

11. The electroluminescent device of claim 1, wherein the at least four pixels controlled by the chiplet have different colors.

12. The electroluminescent device of claim 11, wherein the at least four pixels controlled by the chiplet are red, green, blue, and white.

13. The electroluminescent device of claim 1, wherein the transistor drive circuitry of each chiplet includes a first driving transistor having a first channel ratio for controlling a first pixel, and a second driving transistor having a second channel ratio for controlling a second pixel, where the first pixel has a different color than the second pixel, and the first channel ratio is different than the second channel ratio.

14. The electroluminescent device of claim 1, wherein the chiplet controls a plurality of pixels N of a first color and a plurality of pixels M of a second color different than the first color where N is that same as M and is an integer equal to 2 or more.

15. The electroluminescent device of claim 1, wherein the chiplet has a width and a length that is greater than the width, and includes power line arranged parallel to the width of the chiplet.

16. The electroluminescent device of claim 15, wherein the power line is disposed over the center of the chiplet.

17. The electroluminescent device of claim 1, further includes a color filter disposed under the planarization layer.

* * * * *